US009903980B2

(12) United States Patent
Hirayama

(10) Patent No.: US 9,903,980 B2
(45) Date of Patent: Feb. 27, 2018

(54) PHOTOSENSITIVE EPOXY RESIN COMPOSITION FOR OPTICAL WAVEGUIDE, CURABLE FILM FOR FORMATION OF OPTICAL WAVEGUIDE, AND OPTICAL WAVEGUIDE AND OPTICAL/ELECTRICAL TRANSMISSION HYBRID FLEXIBLE PRINTED WIRING BOARD PRODUCED BY USING THE PHOTOSENSITIVE EPOXY RESIN COMPOSITION, AND OPTICAL WAVEGUIDE PRODUCTION METHOD

(71) Applicant: NITTO DENKO CORPORATION, Ibaraki-shi, Osaka (JP)

(72) Inventor: Tomoyuki Hirayama, Ibaraki (JP)

(73) Assignee: NITTO DENKO CORPORATION, Osaka (JP)

( * ) Notice: Subject to any disclaimer, the term of this patent is extended or adjusted under 35 U.S.C. 154(b) by 0 days.

(21) Appl. No.: 14/785,386

(22) PCT Filed: Mar. 11, 2014

(86) PCT No.: PCT/JP2014/056228
§ 371 (c)(1),
(2) Date: Oct. 19, 2015

(87) PCT Pub. No.: WO2014/174924
PCT Pub. Date: Oct. 30, 2014

(65) Prior Publication Data
US 2016/0070029 A1  Mar. 10, 2016

(30) Foreign Application Priority Data

Apr. 26, 2013 (JP) ................................. 2013-094224

(51) Int. Cl.

| | |
|---|---|
| *G02B 6/00* | (2006.01) |
| *G02B 6/10* | (2006.01) |
| *G02B 1/04* | (2006.01) |
| *C08G 59/20* | (2006.01) |
| *C08G 59/68* | (2006.01) |
| *G02B 6/138* | (2006.01) |
| *G03F 7/00* | (2006.01) |
| *G03F 7/039* | (2006.01) |
| *H05K 1/02* | (2006.01) |
| *H05K 1/03* | (2006.01) |

(52) U.S. Cl.
CPC ............. *G02B 1/046* (2013.01); *C08G 59/20* (2013.01); *C08G 59/68* (2013.01); *G02B 1/045* (2013.01); *G02B 6/138* (2013.01); *G03F 7/0005* (2013.01); *G03F 7/039* (2013.01); *H05K 1/0274* (2013.01); *H05K 1/0326* (2013.01); *H05K 1/0393* (2013.01)

(58) Field of Classification Search
CPC ........ G02B 6/132; G02B 6/138; G02B 1/045; G02B 1/046; C08G 59/20; C08G 59/68; G03F 7/0005; G03F 7/038

USPC ..................... 385/14, 123, 126–132
See application file for complete search history.

(56) References Cited

U.S. PATENT DOCUMENTS

| | | | |
|---|---|---|---|
| 7,394,965 B2 | 7/2008 | Utaka et al. | |
| 7,446,159 B1* | 11/2008 | Samukawa | ........... C08F 220/30 522/181 |
| 2007/0223868 A1* | 9/2007 | Utaka | ................... C08G 59/08 385/127 |
| 2010/0256313 A1 | 10/2010 | Nakamura et al. | |
| 2011/0222818 A1 | 9/2011 | Mune et al. | |
| 2011/0280531 A1 | 11/2011 | Hirayama | |
| 2012/0033913 A1 | 2/2012 | Kondou et al. | |
| 2013/0236149 A1 | 9/2013 | Hirayama | |

FOREIGN PATENT DOCUMENTS

| | | |
|---|---|---|
| JP | 2001-281475 A | 10/2001 |
| JP | 2005-274664 A | 10/2005 |
| JP | 2009-084310 A | 4/2009 |
| JP | 2010-197692 A | 9/2010 |
| JP | 2010-230944 A | 10/2010 |
| JP | 2011-027903 A | 2/2011 |
| JP | 2011-237645 A | 11/2011 |
| JP | 2012-001689 A | 1/2012 |
| JP | 2013-186462 A | 9/2013 |
| TW | 200602701 A | 1/2006 |
| WO | 2007/129662 A1 | 11/2007 |
| WO | 2009/041711 A1 | 4/2009 |

OTHER PUBLICATIONS

International Search Report dated Jun. 10, 2014, issued in counterpart Application No. PCT/JP2014/056228 (2 pages).
International Preliminary Report on Patentability (Form PCT/IB/373) issued in counterpart International Application No. PCT/JP2014/056228 dated Nov. 5, 2015 with Forms PCT/IB/373, PCT/IB/338, and PCT/ISA/237, with English translation. (6 pages).

* cited by examiner

*Primary Examiner* — Kaveh C Kianni
*Assistant Examiner* — Hung Lam
(74) *Attorney, Agent, or Firm* — Westerman, Hattori, Daniels & Adrian, LLP

(57) ABSTRACT

The present invention provides a photosensitive epoxy resin composition for an optical waveguide. The photosensitive epoxy resin composition contains: (A) a cresol novolak polyfunctional epoxy resin, the cresol novolak polyfunctional epoxy resin not being fluorene skeleton-containing epoxy resins (C) and (D); (B) a solid bisphenol-A epoxy resin; (C) a solid fluorene skeleton-containing epoxy resin; (D) a liquid fluorene skeleton-containing epoxy resin; and (E) a cationic curing initiator, wherein the components (A) to (E) are each present in a proportion falling within a predetermined range based on the amount of the overall epoxy resin component. Therefore, the photosensitive epoxy resin composition is excellent in coatability, patterning resolution, roll-to-roll process adaptability and the like, and has higher transparency and heat resistance.

8 Claims, No Drawings

US 9,903,980 B2

PHOTOSENSITIVE EPOXY RESIN COMPOSITION FOR OPTICAL WAVEGUIDE, CURABLE FILM FOR FORMATION OF OPTICAL WAVEGUIDE, AND OPTICAL WAVEGUIDE AND OPTICAL/ELECTRICAL TRANSMISSION HYBRID FLEXIBLE PRINTED WIRING BOARD PRODUCED BY USING THE PHOTOSENSITIVE EPOXY RESIN COMPOSITION, AND OPTICAL WAVEGUIDE PRODUCTION METHOD

TECHNICAL FIELD

The present invention relates to a photosensitive epoxy resin composition for use as a material for formation of a core layer or the like of an optical waveguide of an optical waveguide device to be widely used for optical communications, optical information processing and other general optics, a curable film for formation of an optical waveguide, an optical waveguide and an optical/electrical transmission hybrid flexible printed wiring board produced by using the photosensitive epoxy resin composition, and an optical waveguide production method.

BACKGROUND ART

Conventionally, the optical waveguide is produced by irradiating a coating film of a liquid photosensitive monomer mixture with ultraviolet radiation via a mask (see PTL1). Although the resin (liquid photosensitive monomer mixture) has higher photo-curing sensitivity, the coating film of the resin has a higher surface tackiness. Therefore, the coating film is liable to be broken when being brought into contact with a roll in a continuous process such as a roll-to-roll process. Problematically, this results in poorer film productivity. For adaptability to the roll-to-roll process, a photosensitive resin which is solid at an ordinary temperature is generally used (see PTL2).

As the molecular weight of the so-called ordinary-temperature-solid photosensitive resin is increased, the flexibility of an uncured amorphous film of the photosensitive resin is increased, but the patterning resolution is disadvantageously reduced. As the molecular weight of the photosensitive resin is reduced, on the other hand, the patterning resolution is increased, but the flexibility is reduced. Problematically, there is a trade-off relationship between the flexibility and the patterning resolution of the ordinary-temperature-solid photosensitive resin.

An optical waveguide core layer material should satisfy requirements for various properties such as higher refractive index, higher transparency, higher patterning resolution and higher heat resistance. Therefore, optical waveguide makers give various considerations to combination and balance of ingredients to be blended to satisfy the property requirements. There is also a demand for a core layer material which is adaptable to the roll-to-roll process for mass production.

Where an attempt is made to satisfy the requirements for lower tackiness, flexibility and the like by providing an uncured film of the optical waveguide core layer material in the form of a dry film for the adaptability to the roll-to-roll process, the design flexibility is liable to be reduced in the development of the material. In addition, it is necessary to provide laminate bases on opposite surfaces of the uncured film to provide the dry film. For resource saving and cost saving, consideration is also given to the adaptability to a wet process in the development of the material (PTL3).

RELATED ART DOCUMENT

Patent Documents

PTL1: JP-A-2001-281475
PTL2: JP-A-2011-27903
PTL3: JP-A-2010-230944
PTL4: JP-A-2011-237645

SUMMARY OF INVENTION

In view of the foregoing, a photosensitive resin composition prepared, for example, by blending plural types of resins in addition to a base material of a specific novolak polyfunctional resin to satisfy the aforementioned property requirements is under development (PTL4). However, a waveguide material for an opto-electric hybrid board is particularly required to have higher transparency, and heat resistance (reflow resistance) to withstand a solder reflow process, and the aforementioned photosensitive resin composition under development still has room for improvement.

In view of the foregoing, it is an object of the present invention to provide a photosensitive epoxy resin composition which is excellent in coatability, patterning resolution, roll-to-roll process adaptability and has higher transparency and heat resistance for an optical waveguide, and a curable film for formation of an optical waveguide, and to provide an optical waveguide and an optical/electrical transmission hybrid flexible printed wiring board produced by using the photosensitive epoxy resin composition, and an optical waveguide production method.

According to a first aspect of the present invention to achieve the above object, there is provided a photosensitive epoxy resin composition for an optical waveguide, the photosensitive epoxy resin composition containing: (A) a cresol novolak polyfunctional epoxy resin, the cresol novolak polyfunctional epoxy resin not being fluorene skeleton-containing epoxy resins (C) and (D); (B) a solid bisphenol-A epoxy resin; (C) a solid fluorene skeleton-containing epoxy resin; (D) a liquid fluorene skeleton-containing epoxy resin; and (E) a cationic curing initiator, wherein the components (A), (B), (C) and (D) are present in proportions of 20 to 40 wt %, 10 to 30 wt %, 25 to 30 wt % and 20 to 25 wt %, respectively, based on the amount of the overall epoxy resin component of the resin composition, wherein the sum of the proportions of the components (A) and (B) and the sum of the proportions of the components (C) and (D) are each 50 wt % based on the amount of the overall epoxy resin component.

According to a second aspect of the present invention, there is provided an optical waveguide formation curable film formed from the photosensitive epoxy resin composition of the first aspect.

According to a third aspect of the present invention, there is provided an optical waveguide which includes an optical waveguide core layer formed from the photosensitive epoxy resin composition of the first aspect. According to a fourth aspect of the present invention, there is provided an optical/electrical transmission hybrid flexible printed wiring board which includes the optical waveguide of the third aspect.

According to a fifth aspect of the present invention, there is provided an optical waveguide production method, which includes the step of forming an optical waveguide core layer from the photosensitive epoxy resin composition of the first aspect by a wet coating process employing a roll-to-roll mechanism.

The inventor of the present invention conducted intensive studies to solve the aforementioned problems. As a result, the inventor found that, where the cresol novolak polyfunctional epoxy resin (A), the solid bisphenol-A epoxy resin (B), the solid fluorene skeleton-containing epoxy resin (C) and the liquid fluorene skeleton-containing epoxy resin (D) are used in combination in proportions falling within the predetermined ranges, the photosensitive epoxy resin composition is excellent in coatability (free from repellency and unevenness during coating), roll-to-roll process adaptability (free from coating film cracking due to the flexibility and the lower tackiness of the uncured film) and patterning resolution, and has higher transparency and heat resistance (reflow resistance) for use as a core layer forming material. Thus, the inventor attained the present invention.

Such an effect is created supposedly for the following reason. Since only lower-hue ingredients are blended for the formulation, the optical waveguide has a lower loss. Further, the photosensitive epoxy resin composition is excellent in patterning resolution supposedly because a polyfunctional epoxy resin having a higher curing rate during photo-curing is used as a major component and other ingredients are blended in proportions that do not impair the required physical properties. Since the ingredients to be used are less susceptible to thermal yellowing, the photosensitive epoxy resin composition has higher reflow resistance. Further, the proportions of the ordinary-temperature-solid components and the ordinary-temperature-liquid component to be blended are properly balanced so as not to impair the required physical properties. This supposedly makes it possible to impart the photosensitive epoxy resin composition with excellent coatability and to impart the uncured amorphous film with flexibility and lower tackiness.

Thus, the inventive photosensitive epoxy resin composition for the optical waveguide employs the cresol novolak polyfunctional epoxy resin (A), the solid bisphenol-A epoxy resin (B), the solid fluorene skeleton-containing epoxy resin (C) and the liquid fluorene skeleton-containing epoxy resin (D) in combination as the epoxy resin component in proportions falling within the predetermined ranges. Therefore, the photosensitive epoxy resin composition is excellent in coatability, patterning resolution, roll-to-roll process adaptability, and has higher transparency and higher heat resistance. Thus, the photosensitive epoxy resin composition exhibits higher performance when being used as a photosensitive varnish for the optical waveguide.

The optical waveguide formation curable film formed from the epoxy resin composition has excellent flexibility and lower tackiness in an uncured state and, therefore, can be easily handled in a winding operation or the like.

An optical waveguide core layer formed by curing the epoxy resin composition has a lower optical waveguide loss and higher reflow resistance. Therefore, the optical waveguide and the optical/electrical transmission hybrid flexible printed wiring board including such core layers each exhibit higher performance.

Where the optical waveguide core layer is formed from the epoxy resin composition by a wet coating process using the roll-to-roll mechanism, the resource saving and the cost saving can be achieved without the need for the laminate bases which may otherwise be required for the formation of the dry film.

DESCRIPTION OF EMBODIMENTS

Embodiments of the present invention will hereinafter be described in detail. However, it should be understood that the present invention be not limited to the embodiments.

<Photosensitive Epoxy Resin Composition for Optical Waveguide>

An inventive photosensitive epoxy resin composition for an optical waveguide contains an epoxy resin component including: (A) a cresol novolak polyfunctional epoxy resin; (B) a solid bisphenol-A epoxy resin; (C) a solid fluorene skeleton-containing epoxy resin; and (D) a liquid fluorene skeleton-containing epoxy resin. In the photosensitive epoxy resin composition, the components (A), (B), (C) and (D) are present in proportions of 20 to 40 wt %, 10 to 30 wt %, 25 to 30 wt % and 20 to 25 wt %, respectively, based on the amount of the overall epoxy resin component, and the sum of the proportions of the components (A) and (B) and the sum of the proportions of the components (C) and (D) are each 50 wt % based on the amount of the overall epoxy resin component. In the present invention, the term "liquid" means that the material is in a liquid state at a temperature of 25° C. and may be viscous in a non-solid state, and the term "solid" means that the material is in a solid state at a temperature of 25° C.

The components (A) to (D) and other components will hereinafter be described in order.

<Cresol Novolak Polyfunctional Epoxy Resin (A)>

A compound represented by the following general formula (1) is used as the epoxy resin (A). The epoxy resin (A) may be synthesized with reference to a conventionally known technique, or a commercially available product may be purchased to be prepared as the epoxy resin (A). Examples of the commercially available product include YDCN-700-10 (available from Nippon Steel & Sumikin Chemical Co., Ltd.), YDCN-700-7 (available from Nippon Steel & Sumikin Chemical Co., Ltd.), KI-3000 (available from Nippon Steel & Sumikin Chemical Co., Ltd.) and EOCN series (available from Nippon Kayaku Co., Ltd.), which may be used either alone or in combination

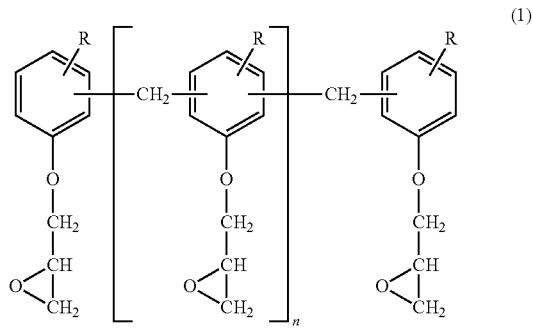

(1)

wherein groups R, which may be the same or different, are each a C1 to C6 alkyl group, and n is a positive number.

<Solid Bisphenol-A Epoxy Resin (B)>

Specific examples of the epoxy resin (B) include phenoxy resins and bisphenol-A epoxy resins, which may be used either alone or in combination. The epoxy resin (B) may be synthesized with reference to a conventionally known technique, or a commercially available product may be purchased to be prepared as the epoxy resin (B). Examples of the commercially available product include YP-70 (available from Nippon Steel & Sumikin Chemical Co., Ltd.), YP-50 (available from Nippon Steel & Sumikin Chemical Co., Ltd.), 1010 (available from Mitsubishi Chemical Corporation), 1007 (available from Mitsubishi Chemical Corporation), 1005 (available from Mitsubishi Chemical Corporation), YD-012W (available from Nippon Steel & Sumikin Chemical Co., Ltd.) and YL-6810 (available from Mitsubishi Chemical Corporation).

<Solid Fluorene Skeleton-Containing Epoxy Resin (C)>

A compound represented by the following general formula (2) is used as the epoxy resin (C). The epoxy resin (C) may be synthesized with reference to a conventionally known technique, or a commercially available product may be purchased to be prepared as the epoxy resin (C). An example of the commercially available product is OGSOL PG-100 (available from Osaka Gas Chemicals Co., Ltd.)

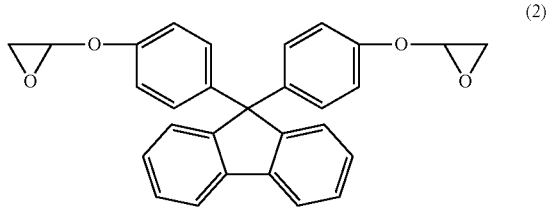 [SMILES: c1ccc2c(c1)-c1ccccc1C2(c1ccc(OC2CO2)cc1)c1ccc(OC2CO2)cc1]

(2)

<Liquid Fluorene Skeleton-Containing Epoxy Resin (D)>

A compound represented by the following general formula (3) is used as the epoxy resin (D). The epoxy resin (D) may be synthesized with reference to a conventionally known technique, or a commercially available product may be purchased to be prepared as the epoxy resin (D). An example of the commercially available product is OGSOL EG-200 (available from Osaka Gas Chemicals Co., Ltd.)

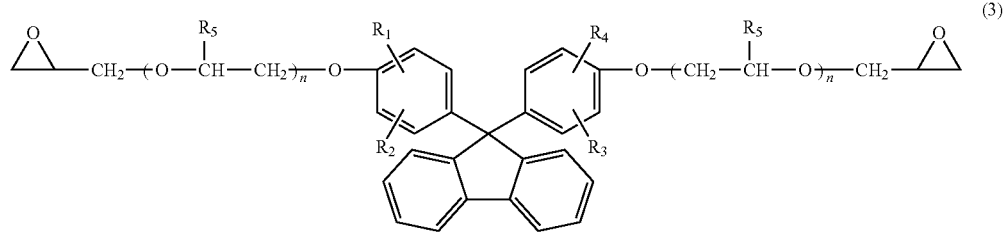

(3)

wherein $R_1$ to $R_4$, which may be the same or different, are each a hydrogen atom or a C1 to C6 alkyl group; $R_5$ and $R_6$, which may be the same or different, are each a hydrogen atom or a methyl group; and each n is an integer of 1 to 10, which may be the same or different.

In the present invention, the proportions of the components (A) to (D) of the inventive photosensitive epoxy resin composition for the optical waveguide are specified in order to satisfy the property requirements such as for coatability, patterning resolution, roll-to-roll process adaptability, higher transparency and heat resistance. In the present invention, the components (A), (B), (C) and (D) are present in proportions of 20 to 40 wt %, 10 to 30 wt %, 25 to 30 wt % and 20 to 25 wt %, respectively, based on the amount of the overall epoxy resin component, and the sum of the proportions of the components (A) and (B) and the sum of the proportions of the components (C) and (D) are each 50 wt % based on the amount of the overall epoxy resin component.

If the proportion of the component (A) is less than the aforementioned range (the proportion of the component (B) is greater than the aforementioned range), the patterning resolution and the coatability are liable to be impaired. If the proportion of the component (A) is greater than the aforementioned range (the proportion of the component (B) is less than the aforementioned range), an amorphous film formed from the resin composition is liable to suffer from cracking in the roll-to-roll process, and an optical waveguide core layer formed from the resin composition is liable to have an increased waveguide loss. If the proportion of the component (C) is less than the aforementioned range (the proportion of the component (D) is greater than the aforementioned range), the coatability is liable to be impaired (the repellency is liable to increase). If the proportion of the component (C) is greater than the aforementioned range (the proportion of the component (D) is less than the aforementioned range), the coatability and the stability of a varnish of the resin composition are liable to be deteriorated. If the total amount of the fluorene-containing components is less than 50 wt % based on the amount of the overall epoxy resin component, the light confining capability of the optical waveguide is liable to decrease due to reduction in the refractive index of the resin, resulting in increase in bend loss and deterioration in other characteristic properties. In the present invention, therefore, the proportions of the components (A) to (D) are specified in the aforementioned manner.

The inventive photosensitive epoxy resin composition for the optical waveguide contains the following cationic curing initiator (E) in addition to the epoxy resins (A) to (D).

<Cationic Curing Initiator (E)>

Examples of the cationic curing initiator (E) include benzoins, benzoin alkyl ethers, acetophenones, aminoacetophenones, anthraquinones, thioxanthones, ketals, benzophenones, xanthones and phosphine oxides. It is preferred to use an antimony cationic curing initiator as the cationic curing initiator because it imparts the resin composition with yellowing resistance after exposure to light.

Specific examples of the cationic curing initiator (E) include triphenylsulfonium antimony hexafluoride, 2,2-dimethoxy-1,2-diphenylethan-1-one, 1-hydroxycyclohexyl phenyl ketone, 2-hydroxy-2-methyl-1-phenylpropan-1-one, 1-[4-(2-hydroxyethoxy)phenyl]-2-hydroxy-2-methyl-1-propane, 2-hydroxy-1-{4-[4-(2-hydroxy-2-methylpropionyl)benzyl]phenyl}-2-methylpropan-1-one, 2-benzyl-2-dimethylamino-1-(4-morpholinophenyl)-butanone-1,2-methyl-1-(4-methylthiophenyl)-2-morpholinopropan-1-one, bis(2,4,6-trimethylbenzoyl)phenylphosphine oxide, 2,4,6-trimethylbenzoyldiphenylphosphine oxide, bis(η5-2,4-cyclopentadien-1-yl)-bis[2,6-difluoro-3-(1H-pyrrol-1-yl)phenyl]titanium and 2-hydroxy-1-{4-[4-(2-hydroxy-2-methylpropionyl)benzyl]phenyl}-2-methylpropan-1-one, which may be used either alone or in combination. Particularly, triphenylsulfonium antimony hexafluoride is preferred because it imparts the resin composition with yellowing resistance after the exposure to light.

The proportion of the cationic curing initiator (E) is preferably 0.1 to 10 parts by weight, more preferably 0.3 to 5 parts by weight, particularly preferably 0.5 to 2 parts by weight, based on 100 parts by weight (hereinafter referred to simply as "parts") of the resin component (epoxy resins) of the inventive photosensitive epoxy resin composition for the optical waveguide. If the proportion of the cationic curing initiator (E) is excessively small, it will be difficult to provide satisfactory photo-curability by irradiation with ultraviolet radiation. If the proportion of the cationic curing initiator (E) is excessively great, the photosensitivity is liable to increase. This may result in abnormal pattern configuration in the patterning, so that the resulting waveguide is liable to have an increase optical loss.

In addition to the components (A) to (E), as required, the inventive photosensitive epoxy resin composition for the optical waveguide may contain a silane or titanium coupling agent for increasing the adhesiveness, an olefin oligomer, a cycloolefin oligomer or polymer such as a norbornene polymer, a synthetic rubber, a silicone compound or other flexibilizer, a leveling agent, a defoaming agent, an antioxidant and the like. These additives are each blended in a proportion that does not impair the effects of the present invention. These additives may be used either alone or in combination.

The inventive photosensitive epoxy resin composition for the optical waveguide may be prepared in the form of a coating varnish by dissolving the aforementioned ingredients in a conventionally known organic solvent so as to be imparted with a viscosity suitable for the coating.

Examples of the organic solvent include ethyl lactate, methyl ethyl ketone, cyclohexanone, 2-butanone, N,N-dimethylacetamide, diglyme, diethylene glycol methyl ethyl ether, propylene glycol methyl acetate, propylene glycol monomethyl ether, tetramethylfurane and dimethoxyethane. These organic solvents may be used either alone or in combination in a proper amount so as to impart the resin composition with a viscosity suitable for the coating.

An optical waveguide formation curable film (amorphous film), which is formed from the inventive photosensitive epoxy resin composition prepared in the aforementioned manner for the optical waveguide, is easily handled in a winding operation or the like because of its flexibility and lower tackiness in an uncured state.

<<Optical Waveguide>>

Next, an optical waveguide to be produced by employing the inventive photosensitive epoxy resin composition as a core layer forming material will be described.

The optical waveguide according to the present invention includes, for example, a substrate, a cladding layer (under-cladding layer) provided in a predetermined pattern on the substrate, a core layer provided in a predetermined pattern on the cladding layer for transmission of optical signals, and another cladding layer (over-cladding layer) provided over the core layer. In the optical waveguide according to the present invention, the core layer is formed from the aforementioned photosensitive epoxy resin composition for the optical waveguide. In the optical waveguide according to the present invention, the core layer is required to have a higher refractive index than the cladding layers.

The (cured) core layer formed by using the inventive photosensitive epoxy resin composition for the optical waveguide preferably has a refractive index of not lower than 1.59, particularly preferably not lower than 1.596. The refractive index of the (cured) core layer is measured, for example, by forming a (cured) core layer having a thickness of about 10 μm and measuring the refractive index of the cured core layer at 850 nm by means of a prism coupler (SPA-4000) available from SAIRON TECHNOLOGY, Inc.

In the present invention, the optical waveguide is produced, for example, through the following process steps. A substrate is prepared, and an under-cladding layer forming photosensitive varnish is applied on the substrate. A photomask for exposure in a predetermined pattern (optical waveguide pattern) is provided on the resulting varnish coating film. Then, the varnish coating film is irradiated with light such as ultraviolet radiation via the photomask and, as required, heat-treated to be thereby cured. Thereafter, an unexposed portion of the varnish coating film not irradiated with the light is dissolved away with the use of a developing liquid. Thus, the under-cladding layer (lower cladding layer portion) is formed as having the predetermined pattern.

In turn, a core layer forming material (varnish) of the inventive photosensitive epoxy resin composition for the optical waveguide is applied on the under-cladding layer to form an uncured core formation layer. Then, a photomask for exposure in a predetermined pattern (optical waveguide pattern) is provided on the core formation layer. Subsequently, the core formation layer is irradiated with light such as ultraviolet radiation via the photomask and, as required, heat-treated. Thereafter, an unexposed portion of the core formation layer is dissolved away with the use of a developing liquid. Thus, the core layer is formed as having the predetermined pattern.

Subsequently, an over-cladding layer forming photosensitive varnish is applied over the core layer. Then, the resulting varnish coating film is irradiated with light such as ultraviolet radiation and, as required, heat-treated, whereby the over-cladding layer (upper cladding layer portion) is formed. Thus, the intended optical waveguide is produced through these process steps.

The optical waveguide thus produced has a lower optical waveguide loss and excellent reflow resistance due to the characteristic properties of the core layer, and is usable, for example, for an optical/electrical transmission hybrid flexible printed wiring board. The optical waveguide and the optical/electrical transmission hybrid flexible printed wiring board including such core layers each exhibit excellent performance.

Exemplary substrate materials include a silicon wafer, a metal substrate, a polymer film and a glass substrate. Examples of the metal substrate include stainless steel plates such as of JIS SUS. Specific examples of the polymer film include a polyethylene terephthalate (PET) film, a polyethylene naphthalate film and a polyimide film. The substrate typically has a thickness of 10 μm to 3 mm.

Specifically, the light irradiation may be irradiation with ultraviolet radiation. Exemplary light sources for the irradiation with the ultraviolet radiation include a low pressure mercury lamp, a high pressure mercury lamp and an ultrahigh pressure mercury lamp. The dose of the ultraviolet radiation is typically about 10 to about 20000 mJ/cm$^2$, preferably about 100 to about 15000 mJ/cm$^2$, more preferably about 500 to about 10000 mJ/cm$^2$.

After the exposure by the irradiation with the ultraviolet radiation, a heat treatment may be further performed to complete a photoreaction for the curing. Conditions for the heat treatment are typically a temperature of 80° C. to 250°

C. and a period of 10 seconds to 2 hours, preferably a temperature of 100° C. to 150° C. and a period of 5 minutes to 1 hour.

Where the inventive photosensitive epoxy resin composition for the optical waveguide is used as the core layer forming material, the under-cladding layer forming material and the over-cladding layer forming material may be, for example, a resin composition containing a solid polyfunctional aromatic epoxy resin, a solid (viscous) fluorene-containing bi-functional epoxy resin and any of the aforementioned cationic curing initiators. The cladding layer forming materials are each prepared in the form of a varnish for the coating by blending a conventionally known organic solvent with the aforementioned ingredients to be imparted with a viscosity suitable for the coating.

Examples of the organic solvent include ethyl lactate, methyl ethyl ketone, cyclohexanone, 2-butanone, N,N-dimethylacetamide, diglyme, diethylene glycol methyl ethyl ether, propylene glycol methyl acetate, propylene glycol monomethyl ether, tetramethylfurane and dimethoxyethane. These organic solvents may be used either alone or in combination in a proper amount so as to impart the varnish with a viscosity suitable for the coating.

Exemplary methods for application of each of the layer forming materials on the substrate include coating methods employing a spin coater, a coater, a spiral coater, a bar coater or the like, a screen printing method, a capillary injection method in which the material is injected into a gap formed with the use of spacers by the capillary phenomenon, and a continuous roll-to-roll coating process employing a coating machine such as a multi-coater. The optical waveguide may be provided in the form of a film optical waveguide by removing the substrate.

Where the inventive photosensitive epoxy resin composition for the optical waveguide is used for the formation of the core layer by the roll-to-roll process, the amorphous film of the photosensitive epoxy resin composition is less liable to suffer from the cracking. Therefore, the roll-to-roll process is preferably employed for mass production of the optical waveguide. Where the optical waveguide core layer is formed from the inventive photosensitive epoxy resin composition by a wet coating process using a roll-to-roll mechanism, the resource saving and the cost saving can be achieved without the need for the laminate bases which may otherwise be required for the formation of the dry film.

EXAMPLES

Next, the present invention will be described by way of examples thereof in conjunction with comparative examples. However, it should be understood that the present invention be not limited to these examples.

Example 1

Preparation of Core Forming Varnish

Under shaded conditions, 20 parts of a cresol novolak epoxy resin (YDCN-700-10 available from Nippon Steel & Sumikin Chemical Co., Ltd.), 30 parts of a solid bisphenol-A epoxy resin (1007 available from Mitsubishi Chemical Corporation), 25 parts of a solid fluorene skeleton-containing epoxy resin (OGSOL PG-100 available from Osaka Gas Chemicals Co., Ltd.), 25 parts of a liquid (viscous) fluorene skeleton-containing epoxy resin (OGSOL EG-200 available from Osaka Gas Chemicals Co., Ltd.) and 1.0 part of a cationic curing initiator (ADEKAOPTOMER SP-170 available from Adeka Corporation) were mixed with 50 parts of cyclohexanone, and completely dissolved in cyclohexanone at 85° C. with heating and stirring. Thereafter, the resulting mixture was cooled to a room temperature, and then filtered by a heat and pressure filtering process with the use of a membrane filter having a pore diameter of 1.0 µm. Thus, a core forming photosensitive varnish was prepared.

<Production of Optical Waveguide>
(Preparation of Cladding Layer Forming Varnish)

Under shaded conditions, 80 parts of a liquid long-chain bi-functional semi-aliphatic epoxy resin (EXA-4816 available from DIC Corporation), 20 parts of a solid polyfunctional aliphatic epoxy resin (EHPE 3150 available from Daicel Chemical Industries Ltd.) and 2.0 parts of a cationic curing initiator (ADEKAOPTOMER SP-170 available from Adeka Corporation) were mixed with 40 parts of ethyl lactate, and completely dissolved in ethyl lactate at 85° C. with heating and stirring. Thereafter, the resulting mixture was cooled to a room temperature, and then filtered by a heat and pressure filtering process with the use of a membrane filter having a pore diameter of 1.0 µm. Thus, a cladding layer forming photosensitive varnish was prepared.

(Formation of Under-Cladding Layer)

The cladding layer forming varnish was applied on a silicon wafer by means of a spin coater, and then the solvent was dried on a hot plate (at 130° C. for 10 minutes). In turn, the resulting coating film was exposed to light via a predetermined mask pattern (pattern width/pattern pitch (L/S)=50 µm/200 µm) by means of a UV irradiation machine (at 5000 mJ/cm$^2$ (with an I-line filter)), and then subjected to a post heat treatment (at 130° C. for 10 minutes). Thereafter, the resulting coating film was developed in γ-butyrolactone (at a room temperature for 3 minutes) and rinsed with water, and then dried on a hot plate (at 120° C. for 10 minutes) for removal of water. Thus, an under-cladding layer (having a thickness of 15 µm) was formed on the silicon wafer.

<Formation of Core Layer>

The core layer forming varnish was applied on the thus formed under-cladding layer by means of a spin coater, and then the solvent was dried on a hot plate (at 150° C. for 5 minutes). Thus, a core formation layer was formed in an uncured film state. The uncured core formation layer thus formed was exposed to light via a predetermined mask pattern (pattern width/pattern pitch (L/S)=50 µm/200 µm) by means of a UV irradiation machine (at 9000 mJ/cm$^2$ (with an I-line filter)), and then subjected to a post heat treatment (at 130° C. for 10 minutes). Thereafter, the resulting core formation layer was developed in γ-butyrolactone (at a room temperature for 4 minutes) and rinsed with water, and then dried on a hot plate (at 120° C. for 10 minutes) for removal of water. Thus, a core layer (having a thickness of 50 µm) was formed.

<Formation of Over-Cladding Layer>

The cladding layer forming varnish was applied over the thus formed core layer by means of a spin coater, and then the solvent was dried on a hot plate (at 130° C. for 10 minutes). In turn, the resulting coating film was exposed to light at 5000 mJ/cm$^2$ (with an I-line filter), and then subjected to a PEB process at 130° C. for 10 minutes. Thereafter, the resulting coating film was developed in γ-butyrolactone (at a room temperature for 3 minutes) and rinsed with water, and then dried on a hot plate (at 120° C. for 10 minutes) for removal of water. Thus, an over-cladding layer (having a thickness of 10 µm as measured from the core layer) was formed.

In this manner, an optical waveguide (having an overall thickness of 75 μm) was produced, which included the under-cladding layer formed on the silicon wafer, the core layer formed in the predetermined pattern on the under-cladding layer, and the over-cladding layer formed over the core layer.

Example 2

A core forming varnish was prepared in substantially the same manner as in Example 1, except that the proportions of the cresol novolak epoxy resin (YDCN-700-10) and the solid bisphenol-A epoxy resin (1007) to be used as the core varnish material were changed to 30 parts and 20 parts, respectively. Then, an optical waveguide was produced in the same manner as in Example 1 by using the core forming varnish thus prepared.

Example 3

A core forming varnish was prepared in substantially the same manner as in Example 1, except that the proportions of the cresol novolak epoxy resin (YDCN-700-10) and the solid bisphenol-A epoxy resin (1007) to be used as the core varnish material were changed to 40 parts and 10 parts, respectively. Then, an optical waveguide was produced in the same manner as in Example 1 by using the core forming varnish thus prepared.

Comparative Example 1

A core forming varnish was prepared in substantially the same manner as in Example 1, except that the proportions of the solid fluorene skeleton-containing epoxy resin (OGSOL PG-100) and the liquid (viscous) fluorene skeleton-containing epoxy resin (OGSOL EG-200) to be used as the core varnish material were changed to 20 parts and 30 parts, respectively. Then, an optical waveguide was produced in the same manner as in Example 1 by using the core forming varnish thus prepared.

Comparative Example 2

A core forming varnish was prepared in substantially the same manner as in Example 1, except that the proportions of the solid fluorene skeleton-containing epoxy resin (OGSOL PG-100) and the liquid (viscous) fluorene skeleton-containing epoxy resin (OGSOL EG-200) to be used as the core varnish material were changed to 40 parts and 10 parts, respectively. Then, an optical waveguide was produced in the same manner as in Example 1 by using the core forming varnish thus prepared.

Comparative Example 3

A core forming varnish was prepared in substantially the same manner as in Example 1, except that the proportions of the cresol novolak epoxy resin (YDCN-700-10) and the solid bisphenol-A epoxy resin (1007) to be used as the core varnish material were changed to 10 parts and 40 parts, respectively. Then, an optical waveguide was produced in the same manner as in Example 1 by using the core forming varnish thus prepared.

Comparative Example 4

A core forming varnish was prepared in substantially the same manner as in Example 1, except that the proportion of the cresol novolak epoxy resin (YDCN-700-10) to be used as the core varnish material was changed to 50 parts and the solid bisphenol-A epoxy resin (1007) was not contained in the core forming varnish. Then, an optical waveguide was produced in the same manner as in Example 1 by using the core forming varnish thus prepared.

Comparative Example 5

A core forming varnish was prepared in substantially the same manner as in Example 1, except that the cresol novolak epoxy resin (YDCN-700-10) was used alone as the epoxy resin component of the core varnish material. Then, an optical waveguide was produced in the same manner as in Example 1 by using the core forming varnish thus prepared.

Comparative Example 6

A core forming varnish was prepared in substantially the same manner as in Example 1, except that a specific novolak epoxy resin (157S70 available from Mitsubishi Chemical Corporation) was used alone as the epoxy resin component of the core varnish material. Then, an optical waveguide was produced in the same manner as in Example 1 by using the core forming varnish thus prepared.

The core forming varnishes and the optical waveguides of Examples and Comparative Examples thus prepared were evaluated for various characteristic properties based on the following criteria. The evaluation results are shown below along with the formulations of the core forming varnishes in Table 1.

[Varnish Stability]

The core forming varnishes thus prepared were each allowed to stand still at an ordinary temperature in a desiccator box for one week, and visually checked for turbidity for evaluation based on the following criteria:

Acceptable (o): The varnish was transparent without turbidity.

Turbid (x): The varnish suffered from turbidity (Precipitation of the fluorene skeleton-containing epoxy resin was observed).

(Coatability (Repellency and Unevenness))

The core forming varnishes thus prepared were each applied on a silicon wafer (to a prebaked coating film thickness of about 50 μm), and then prebaked (dried) on a hot plate at 150° C. for 5 minutes. Then, the surface of the coating film was visually checked for evaluation based on the following criteria:

Repelled: The varnish was repelled 3 mm or more away from the edges of the silicon wafer toward the center of the silicon wafer.

Uneven: The coating film suffered from surface unevenness, failing to ensure coating film uniformity.

Acceptable (o): The varnish was free from the unevenness and the repellency.

(Tackiness)

The core forming varnishes thus prepared were each applied on a silicon wafer (to a prebaked coating film thickness of about 50 μm), and prebaked (dried) on a hot plate at 150° C. for 5 minutes. The surface of the resulting coating film was checked by finger touch for evaluation based on the following criteria:

Acceptable (o): The coating film was free from tackiness and surface roughening.

Unacceptable (x): The coating film had tackiness and suffered from surface roughening.

(R-to-R Adaptability)

The core forming varnishes thus prepared were each applied on a stainless steel base (to a prebaked coating film thickness of about 50 μm), and prebaked (dried) on a hot plate at 150° C. for 5 minutes to form an amorphous film on the stainless steel base. The film was wound up around a 10-cm diameter winding core. The film was evaluated for the roll-to-roll process (R-to-R) adaptability based on the following criteria:

Acceptable (o): The film was free from cracking during the winding up to have the R-to-R adaptability.

Unacceptable (x): The film suffered from cracking during the winding up and, therefore, did not have the R-to-R adaptability.

[Reflow Resistance]

The optical waveguides were each used as a sample. The sample was exposed to a heating process (reflow heating process) at a peak temperature of 250° C. to 255° C. for 45 seconds in a nitrogen atmosphere by means of a reflow simulator (SMT Scope SK-5000 available from Sanyoseiko Co., Ltd.) Then, the sample was checked in the aforementioned manner, and evaluated for the waveguide loss based on the following criteria:

Acceptable (o): The sample had a total linear loss of not greater than 0.1 dB/cm after the reflow heating process.

Unacceptable (x): The sample had a total linear loss of greater than 0.1 dB/cm after the reflow heating process.

TABLE 1

|  | Example | | | Comparative Example | | | | | | (parts) |
| --- | --- | --- | --- | --- | --- | --- | --- | --- | --- | --- |
|  | 1 | 2 | 3 | 1 | 2 | 3 | 4 | 5 | 6 | |
| YDCN-700-10 | 20 | 30 | 40 | 20 | 20 | 10 | 50 | 100 | — | |
| 157S70 | — | — | — | — | — | — | — | — | 100 | |
| 1007 | 30 | 20 | 10 | 30 | 30 | 40 | — | — | — | |
| OGSOL PG-100 | 25 | 25 | 25 | 20 | 40 | 25 | 25 | — | — | |
| OGSOL EG-200 | 25 | 25 | 25 | 30 | 10 | 25 | 25 | — | — | |
| ADEKAOPTOMER SP-170 | 1 | 1 | 1 | 1 | 1 | 1 | 1 | 1 | 1 | |
| Cyclohexanone | 50 | 50 | 50 | 50 | 50 | 50 | 50 | 50 | 50 | |
| Varnish stability | o | o | o | o | Turbid | o | o | o | o | |
| Coatability | o | o | o | Repelled | — | Uneven | o | o | o | |
| Tackiness | o | o | o | o | — | o | o | o | o | |
| R-to-R adaptability | o | o | o | o | — | o | x | x | o | |
| Patterning resolution | o | o | o | o | — | x | o | o | o | |
| Waveguide loss | o | o | o | o | — | x | x | o | x | |
| Reflow resistance | o | o | o | o | — | x | x | o | x | |

(Patterning Resolution)

The configuration of the core pattern formed on the under-cladding layer in the production of each of the optical waveguides was observed by means of an optical microscope, and evaluated based on the following criteria:

Acceptable (o): The core pattern had a clear rectangular shape without any configurational abnormality (pattern waviness and bottom expansion).

Unacceptable (x): The core pattern did not have a clear rectangular shape with configurational abnormality.

(Waveguide Loss)

The optical waveguides were each used as a sample. Light emitted from a light source (850-nm VCSEL light source OP250 available from Miki Inc.) was collected and inputted into the sample by means of a multi-mode fiber (FFP-G120-0500 available from Miki Inc.) having an MMF diameter of 50 μm and an NA of 0.2. Then, light outputted from the sample was collected by a lens (FH14-11 available from Seiwa Optical Co., Ltd.) having a magnification of 20× and an NA of 0.4, and detected at 6 channels by a light measurement system (optical multi-power meter Q8221 available from Advantest Corporation) for evaluation. The sample was evaluated for the linear loss from an average total loss for the six channels based on the following criteria:

Acceptable (o): The sample had a total linear loss of not greater than 0.1 dB/cm.

Unacceptable (x): The sample had a total linear loss of greater than 0.1 dB/cm.

The above results indicate that the varnishes of Examples were excellent in varnish stability, coatability, tackiness, R-to-R adaptability and patterning resolution. Further, the optical waveguides of Examples produced by employing these varnishes each had a lower loss and higher reflow resistance. Therefore, the core forming varnishes each had well-balanced properties.

In contrast, the core forming varnishes of Comparative Examples 1 to 5, which each contained the ingredients in proportions falling outside the predetermined ranges, failed to have well-balanced properties as in Examples, suffering from the repellency and unevenness in the coating process. Further, the uncured films of the core forming varnishes suffered from cracking during the roll-to-roll process. The core forming varnish of Comparative Example 6 was excellent in varnish properties and R-to-R adaptability, but the optical waveguide produced by using the core forming varnish had a higher waveguide loss and lower reflow resistance.

While specific forms of the embodiments of the present invention have been shown in the aforementioned inventive examples, the inventive examples are merely illustrative of the invention but not limitative of the invention. It is contemplated that various modifications apparent to those skilled in the art could be made within the scope of the invention.

The inventive photosensitive epoxy resin composition for the optical waveguide is useful as an optical waveguide component forming material, particularly as a core layer forming material. Further, the optical waveguide produced by using the aforementioned photosensitive epoxy resin composition is usable, for example, as an optical/electrical transmission hybrid flexible printed wiring board and the like.

The invention claimed is:

1. A photosensitive epoxy resin composition for an optical waveguide, the photosensitive epoxy resin composition comprising:
(A) a cresol novolak polyfunctional epoxy resin, the cresol novolak polyfunctional epoxy resin not being fluorene skeleton-containing epoxy resins (C) and (D);
(B) a solid bisphenol-A epoxy resin;
(C) a solid fluorene skeleton-containing epoxy resin;
(D) a liquid fluorene skeleton-containing epoxy resin; and
(E) a cationic curing initiator;
wherein the components (A), (B), (C) and (D) are present in proportions of 20 to 40 wt %, 10 to 30 wt %, 25 to 30 wt % and 20 to 25 wt %, respectively, based on a total amount of the epoxy resins; and
wherein a sum of the proportions of the components (A) and (B) is 50 wt % based on the total amount of the epoxy resins and a sum of the proportions of the components (C) and (D) is 50 wt % based on the total amount of the epoxy resins.

2. A photosensitive epoxy resin composition for an optical waveguide according to claim 1, wherein the cresol novolak polyfunctional epoxy resin (A) is a compound represented by the following general formula (1):

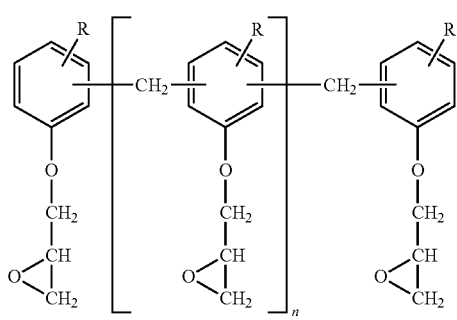

wherein groups R, which may be the same or different, are each a C1 to C6 alkyl group, and n is a positive number.

3. A photosensitive epoxy resin composition for an optical waveguide according to claim 1, wherein the solid fluorene skeleton-containing epoxy resin (C) is a compound represented by the following general formula (2):

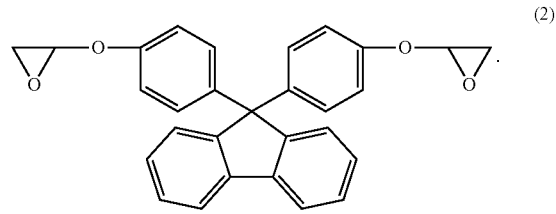

4. A photosensitive epoxy resin composition for an optical waveguide according to claim 1, wherein the liquid fluorene skeleton-containing epoxy resin (D) is a compound represented by the following general formula (3):

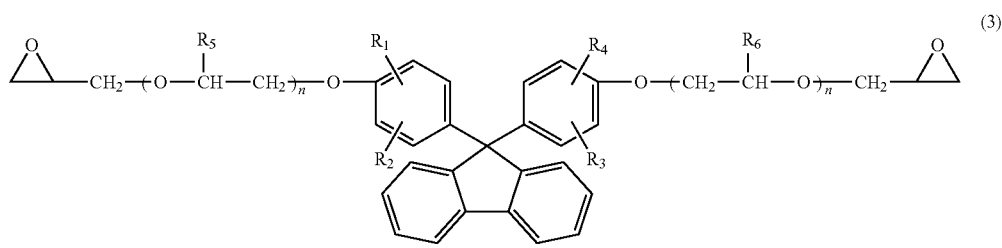

wherein $R_1$ to $R_4$, which may be the same or different, are each a hydrogen atom or a C1 to C6 alkyl group,
wherein $R_5$ and $R_6$, which may be the same or different, are each a hydrogen atom or a methyl group, and
wherein each n is an integer of 1 to 10, which may be the same or different.

5. An optical waveguide formation curable film comprising the photosensitive epoxy resin composition according to claim 1.

6. An optical waveguide comprising:
a cladding layer; and
a core layer provided in a predetermined pattern in the cladding layer for transmission of an optical signal,
wherein the core layer is formed from the photosensitive epoxy resin composition according to claim 1.

7. An optical/electrical transmission hybrid flexible printed wiring board which includes the optical waveguide according to claim 6.

8. An optical waveguide production method comprising:
forming an under-cladding layer;
forming a core layer on the under-cladding layer; and
forming an over-cladding layer over the core layer;
wherein the core layer forming step includes the step of forming the core layer from the photosensitive epoxy resin composition according to claim 1 by a wet coating process employing a roll-to-roll mechanism.

* * * * *